United States Patent [19]

Ponn

[11] Patent Number: 5,141,455
[45] Date of Patent: Aug. 25, 1992

[54] MOUNTING OF ELECTRONIC COMPONENTS ON SUBSTRATES

[75] Inventor: Timothy R. Ponn, Aurora, Ill.

[73] Assignee: Molex Incorporated, Lisle, Ill.

[21] Appl. No.: 681,826

[22] Filed: Apr. 8, 1991

[51] Int. Cl.$^5$ .......................................... H01R 13/66
[52] U.S. Cl. ...................................... 439/620; 29/832; 29/845
[58] Field of Search .................. 439/67, 77, 492, 497, 439/620; 361/398, 400, 406, 408; 29/829, 832, 835, 845

[56] References Cited

U.S. PATENT DOCUMENTS

| | | |
|---|---|---|
| 4,024,627 | 5/1977 | Stauffer . |
| 4,217,017 | 8/1980 | Huebner ........................ 439/77 X |
| 4,316,320 | 2/1982 | Nogawa et al. .................. 29/832 X |
| 4,674,815 | 6/1987 | Chambers et al. . |
| 4,714,435 | 12/1987 | Stipanuk et al. ................ 439/620 X |
| 4,990,724 | 2/1991 | Suppelsa et al. ............... 361/398 X |
| 5,041,183 | 8/1991 | Nakamura et al. ............. 439/77 X |
| 5,047,895 | 10/1991 | Sasaki ............................. 361/400 X |

FOREIGN PATENT DOCUMENTS

| | | |
|---|---|---|
| 0303485 | 2/1989 | European Pat. Off. . |
| 0225191 | 9/1989 | Japan ............................... 439/67 |

*Primary Examiner*—Eugene F. Desmond
*Attorney, Agent, or Firm*—A. A. Tirva

[57] ABSTRACT

A method for mounting electronic components, such as capacitors and the like, to a flat flexible insulating substrate having conductive material thereon. In one form of the invention, an electronic component is attached to a given area of the substrate with one conductive side of the electronic component in electrical connection with the conductive material on the substrate. A slot is formed in the substrate substantially about the electronic component but less than 360° thereabout to define a tongue, including the electronic component, and an integral hinge portion of the substrate. The tongue is bent about the integral hinge portion to move the tongue out of the plane of the substrate and thereby move the electronic component therewith into a desired position for connection of an opposite conductive side of the electronic component to an appropriate terminal. In another form of the invention, a closed or 360° slot is formed in the substrate. One conductive side of the electronic component is in electrical connection with the conductive material on the substrate within the closed slot, and the other conductive side of the electronic component is in electrical connection with the conductive material on the substrate outside the closed slot. A terminal is electrically connected to the conductive material on the substrate inside the closed slot.

45 Claims, 3 Drawing Sheets

MOUNTING OF ELECTRONIC COMPONENTS ON SUBSTRATES

FIELD OF THE INVENTION

This invention generally relates to the art of electrical connectors and, particularly, to shielded or filtered connectors and, more specifically, to the mounting of electronic components, such as capacitors and the like, on a flat flexible insulating substrate with conductive material thereon and which may be used as a ground plane in electrical connectors.

BACKGROUND OF THE INVENTION

There are a variety of electrical connectors which are termed "filter" connectors, in that an electronic component, such as a capacitor, is coupled between the terminals of the connector and a ground plate or plane normally mounted to a face of a dielectric housing of the connector. The filters are used to suppress electromagnetic interference and radio frequency interference entering the connector system.

One of the problems with such filter connectors simply is their cost. Normally, a ground plate is fabricated of stamped and formed conductive metal material and must be mounted separately to the dielectric housing of the connector. Terminals then are mounted in the connector housing. The filter capacitors then must be coupled between the terminals and the ground plate. These steps are time consuming and require assembly tooling, all of which adds considerably to the cost of the connectors. In a mass production environment, reliability and performance often have much to be desired.

This invention is directed to solving the above problems by providing unique methods of mounting electronic components, such as capacitors, to flexible substrates which eventually become the ground planes of electrical connectors, the assemblies being fabricated to facilitate mass production of electrical connectors, particularly multi-conductor/terminal connectors.

SUMMARY OF THE INVENTION

An object, therefore, of the invention is to provide a method for mounting electronic components, such as capacitors and the like, to flat flexible insulating substrates with conductive material thereon.

Another object of the invention is to provide electrical devices wherein electronic components are mounted to flat flexible insulating substrates which can be used as ground planes of electrical connectors.

In one form of the invention, it is contemplated that an electronic component is attached to a given area of the flexible substrate, with one conductive side of the component in electrical connection with conductive material on the substrate. A slot is formed in the substrate substantially about the electronic component but less than 360° thereabout to define an integral hinge portion of the substrate. The substrate then is bent about the integral hinge portion to move the given area of attachment of the electronic component out of the flat plane of the substrate, thereby moving the electronic component into a desired position for connection of an opposite conductive end of the component to an appropriate terminal.

In the preferred embodiment, the electronic component is attached to the substrate by forming a cut in the substrate and inserting the one conductive side of the electronic component into the cut. The cut may be formed as an aperture having a width less than the width of the electronic component, with at least one slit in an edge of the aperture to allow the aperture to expand and embrace the electronic component.

The invention contemplates applying a conductive adhesive between the conductive material on the substrate and the one conductive side of the electronic component. The substrate may be in the form of a laminate including an insulating film and a conductive film. In this instance, the conductive adhesive is applied in a local area about the electronic component. Alternatively, the conductive adhesive may be applied, such as by spraying, over a substantial area of the insulating substrate to provide a ground plane thereon in electrical connection with the one side of the electronic component which already has been inserted into the slot in the substrate.

The flexible substrate, with the electronic component already attached thereto, then can be applied to a face of a dielectric housing of an electrical connector, completely obviating a complete step in assembly of prior filter connectors as described above.

By bending a given area of the substrate (about the attached electronic component) out of the plane of the substrate, an opening in the substrate is formed. This opening provides a ready means through which an appropriate terminal can be inserted from one side of the substrate for electrical connection to the electronic component on the opposite side of the substrate.

In another form of the invention, a laminated substrate is provided with an insulating film and a conductive film on one side of the insulating film. At least one, but preferably a series of U-shaped slots are cut in the substrate. An electronic component is attached to the substrate for each U-shaped slot with one conductive side of the component attached to the substrate outside the U-shaped slot and with the other conductive side of the component attached to the substrate inside the U-shaped slot. After attaching the electronic component, as by conductive adhesive or other suitable means, the U-shaped slot is cut further to define a 360° slot which isolates the other conductive side of the component from the one conductive side of the component and the conductive material on one side of the substrate. A terminal is inserted through aperture means in the substrate within the 360° slot, in electrical connection with the conductive material of the substrate and the other conductive side of the electronic component. The aperture means may be provided by slitting the substrate and pushing the terminal therethrough, the terminal being electrically connected by conductive adhesive or the like to the conductive material on the substrate.

Other objects, features and advantages of the invention will be apparent from the following detailed description taken in connection with the accompanying drawings.

BRIEF DESCRIPTION OF THE DRAWINGS

The features of this invention which are believed to be novel are set forth with particularity in the appended claims. The invention, together with its objects and the following description taken in conjunction with the accompanying drawings, in which like reference numerals identify like elements in the figures and in which:

DETAILED DESCRIPTION OF THE PREFERRED EMBODIMENT

Figure 8:
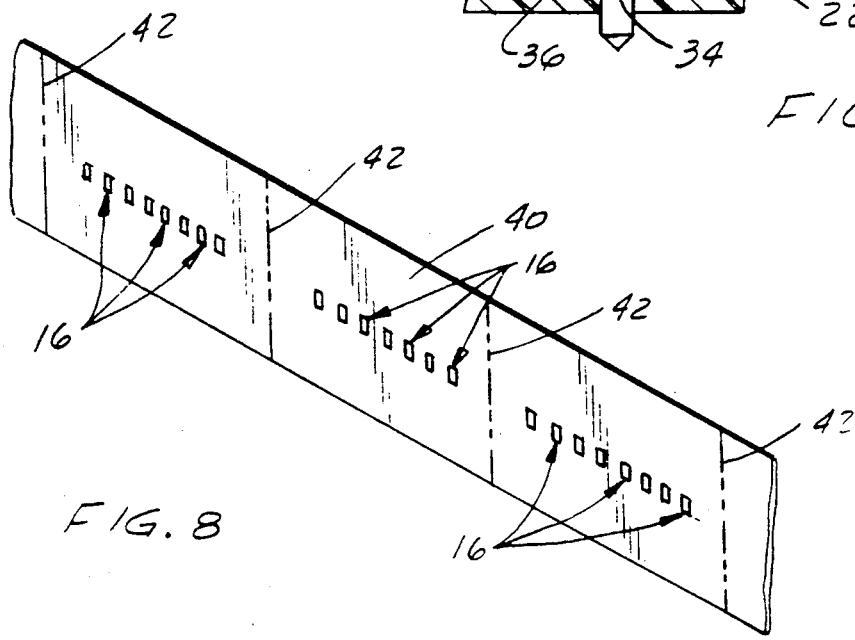
FIG. 8 is a fragmented view of the flexible substrate in strip form, with the cuts shown in spaced row arrays for mass production purposes.
Figure 9:
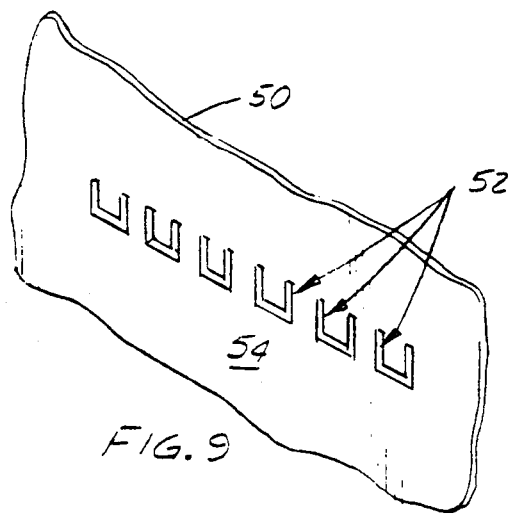
FIG. 9 is a fragmented perspective view of a portion of a flexible substrate having a row of U-shaped slots formed therein, similar to the cuts in FIG. 1 but according to another form of the invention.
Figure 10:
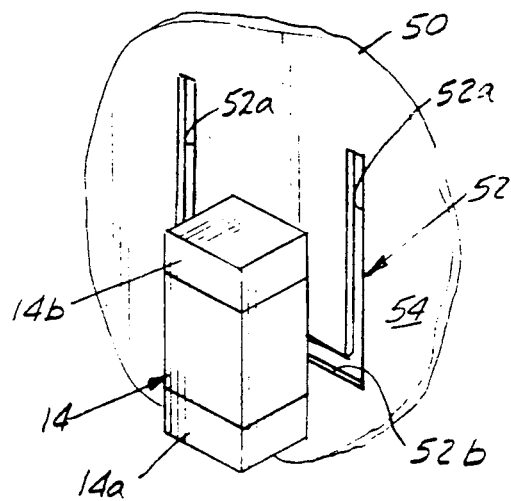
FIG. 10 is a fragmented perspective view, on an enlarged scale, of a portion of the substrate shown in FIG. 1, illustrating a single U-shaped slot in conjunction with a capacitor attached to a conductive side of the substrate.
Figure 11:
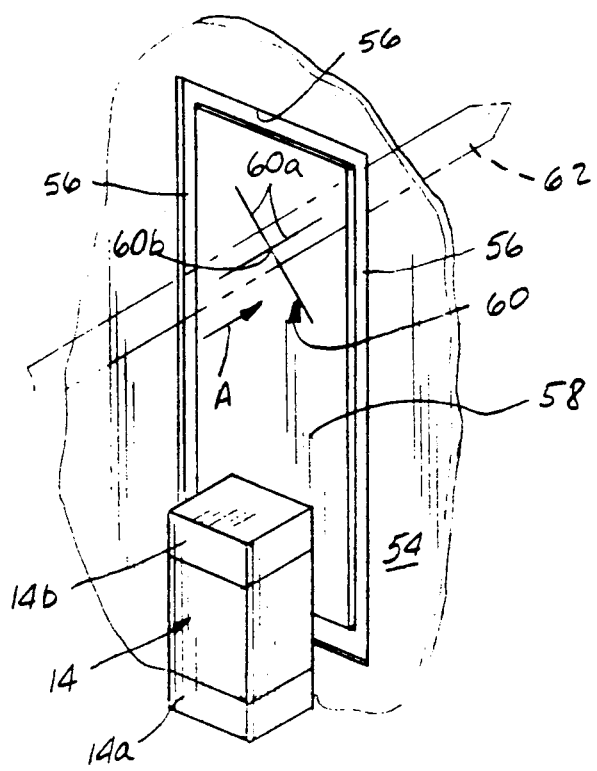
FIG. 11 is a view similar to that of FIG. 10, but with the U-shaped slots further cut to form a rectangular, 360° isolated portion of the substrate, with a slit in the isolated portion for receiving a terminal.

Referring to the drawings in greater detail, the invention is directed, generally, to a method for mounting electronic components, such as capacitors and the like, on a flat flexible insulating substrate having conductive material thereon. FIGS. 1-8 illustrate one form of the invention, and FIGS. 9-11 illustrate another form of the invention.

Figure 1:
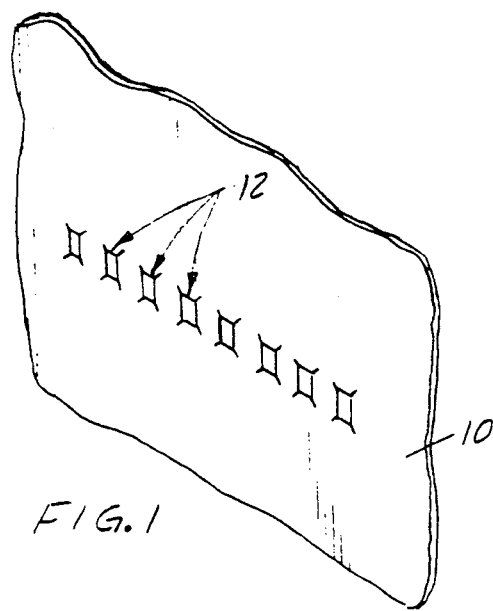
FIG. 1 is a fragmented perspective view of a portion of a flexible substrate having a row of cuts formed therein, according to one form of the invention.

Referring first to FIG. 1 and the first form of the invention, a section of a flat flexible substrate 10 is shown with a plurality of cuts, generally designated 12, in a row along the substrate. The substrate includes an insulating film, such as polyester or the like. As will be described in greater detail hereinafter, the substrate may be in the form of a laminate which includes the polyester film laminated to a ground film such as of aluminum, copper or the like. The outside shape or periphery of the substrate may be of various configurations depending upon the connector design or application with which the substrate is to be used.

Figure 2:
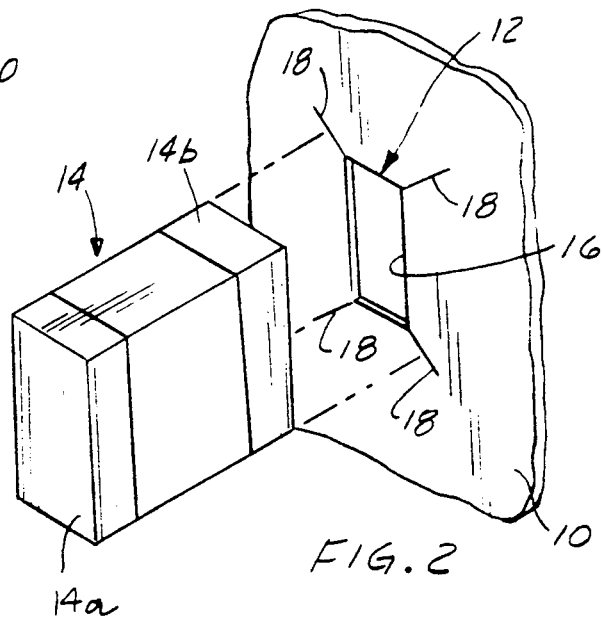
FIG. 2 is a fragmented perspective view, on an enlarged scale, of a portion of the substrate shown in FIG. 1, illustrating a single cut in conjunction with a capacitor to be inserted into the cut.

FIG. 2 shows substrate 10 enlarged to illustrate details of one of the cuts 12, in conjunction with an electronic component, such as a capacitor or other chip device, generally designated 14. Cut 12 is shown in a preferred form wherein an aperture 16 is formed through the substrate, with at least one slit 18 in an edge of the aperture so that the substrate about the aperture can yield on inserting capacitor 14 into aperture 16. The shape of the aperture should be complementary to the shape of the capacitor. As illustrated, the capacitor is generally rectangularly shaped and, consequently, aperture 16 is rectangular, and four slits 18 are provided, one slit at each corner of the aperture. The aperture has length and width dimensions slightly less than the length and width dimensions of capacitor 14 so that the edges of the aperture are self-biased against the side surfaces of the capacitor.

Figure 3:
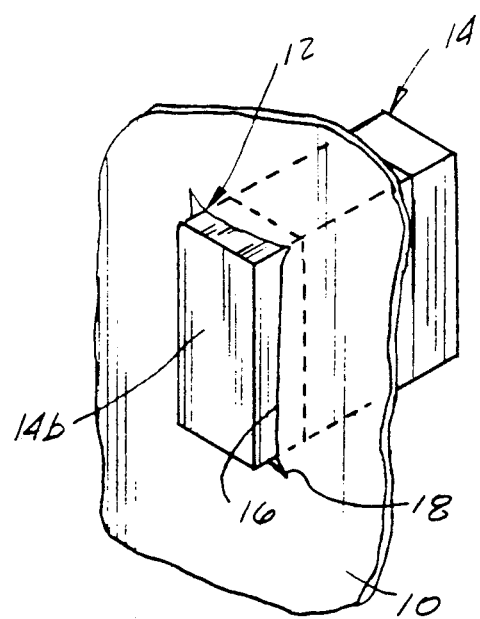
FIG. 3 is a view similar to that of FIG. 2, with the capacitor properly inserted into the cut.

Capacitor 14 has opposite conductive sides 14a and 14b as illustrated in FIG. 2. FIG. 3 shows capacitor 14 inserted through aperture 16 so that one conductive end 14b is engaged by the sides of the aperture. Preferably, the end face of the capacitor (i.e., the end face of conductive side 14b) is as close to being flush or coplanar with the substrate as is possible and still maintain the capacitor within the aperture.

Figure 4:
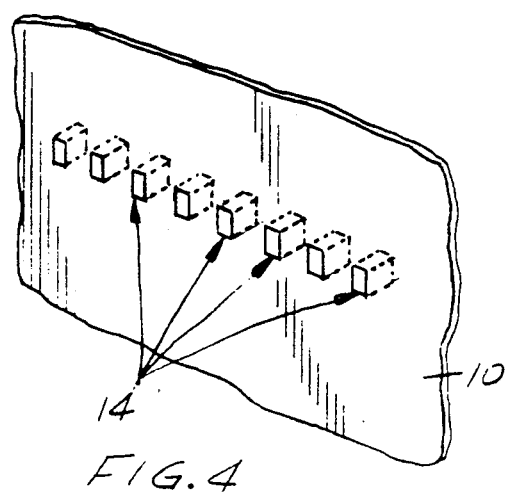
FIG. 4 is a view similar to that of FIG. 1, with a plurality of capacitors inserted through the row of cuts.

FIG. 4 is a view similar to that of FIG. 1, but with each of cuts 12 being "filled" with a respective capacitor 14 for termination to a plurality or linear array of appropriate terminals, as exemplified hereinafter.

At this point, it should be understood that the invention contemplates various manners in which substrate 10 can be used as a ground plane for an appropriate electrical connector. As stated above, the substrate could comprise a laminate of an insulating film and a conductive film. Therefore, when capacitors 14 are secured in apertures 16 in the substrate, and conductive epoxy is applied in a local area between conductive end 14b of each capacitor in a local area about each capacitor, the capacitors are electrically coupled to the conductive film of the laminate.

On the other hand, it is contemplated that the substrate initially would comprise only an insulating film or layer of flat flexible insulating material. After capacitors 14 are inserted into apertures 16, one side of the entire substrate (preferably the side which is substantially coplanar with conductive ends 14b of the capacitors) is coated with a conductive material, including the capacitor ends. The conductive epoxy can be applied by spraying, painting, printing or other appropriate method over the entire substrate and the capacitor ends.

Whether the application of the conductive epoxy is done locally or applied over the entire substrate, the assembly of the substrate and the capacitors inserted into apertures 16 is exposed to a curing medium to cure the epoxy, such as by the application of heat, ultraviolet radiation, or the like.

Figure 5:
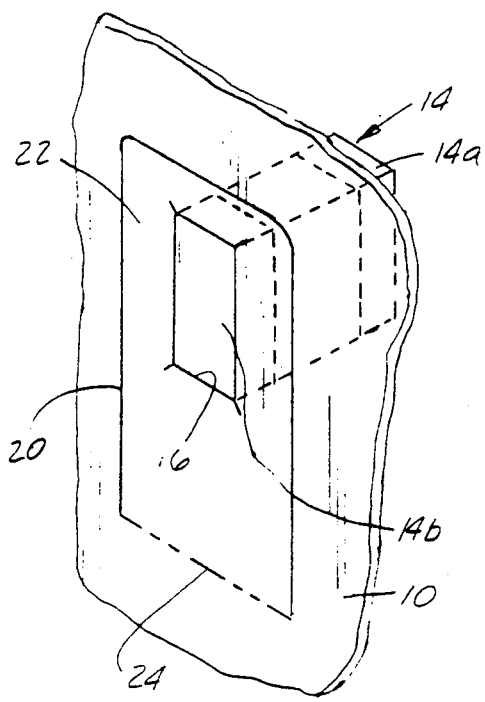
FIG. 5 is a view similar to that of FIG. 3, on an enlarged scale, showing a U-shaped slot about an area of the substrate to which the capacitor is attached.
Figure 6:
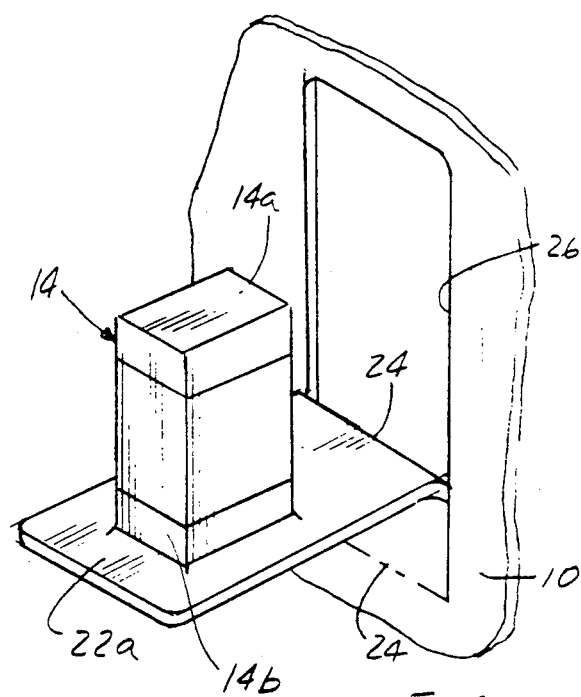
FIG. 6 is a view similar to that of FIG. 5, of the area of the substrate within the U-shaped slot bent out of the plane of the substrate.
Figure 7:
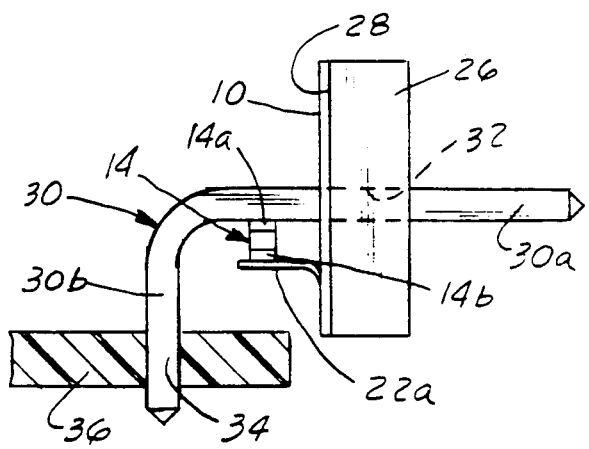
FIG. 7 is an end elevational view of the substrate and a capacitor in the condition shown in FIG. 4, with the substrate secured to a housing of a connector and the capacitor connected to a terminal extending through the housing.

FIGS. 5-7 illustrate a novel technique in which the assembly of substrate 10 and capacitors 14 can be incorporated in an electrical connector to comprise the ground plane for the connector as well as positioning the capacitors for ready coupling to a plurality of terminals. More particularly, referring first to FIG. 5, a generally U-shaped slot 20 is formed through substrate 10 defining a given area 22 about each capacitor 14. This U-shaped slot forms a living hinge portion of the flexible substrate, as indicated by phantom line 24 spanning the distal ends of the "legs" of the U-shaped slot.

Referring to FIG. 6, area 22 (FIG. 5) thereby defines a tongue 22a which can be bent out of the plane of substrate 10 leaving an opening 26 through the substrate. This opening provides a means through which an appropriate terminal can be inserted entirely through the substrate, perpendicular thereto, for attachment to conductive side 14a by appropriate means such as a conductive adhesive.

FIG. 7 shows the arrangement of substrate 10, bent tongue 22a and capacitor 14 comprising part of an electrical connector assembly. Although shown somewhat schematically, an electrical connector may be provided with a dielectric housing 26, such as a housing of a multi-terminal connector header, having a flat face 28. Substrate 10 is secured to the header by any appropriate means, and, of course, the header can take a variety of configurations depending upon its use or application. A generally L-shaped terminal, generally designated 30, is shown for exemplary purposes and to illustrate the versatility of the invention. The L-shaped terminal includes a horizontal leg 30a and a vertical leg 30b. The horizontal leg extends through the respective opening 26 (FIG. 6) in substrate 10 and through an appropriate hole 32 in header 26. Leg 30a is electrically coupled to conductive side 14a of capacitor 14, as by a conductive adhesive. Vertical leg 30b extends downwardly through a hole 34 in a printed circuit board 36 and is electrically connected to circuit traces either in the hole in the printed circuit board or by soldering to circuit traces on one side of the board. Leg 30a of terminal 30, projecting out from a side of heater 26 opposite the ground plane now provided by substrate 10, can be used as a pin terminal for electrical connection to a respective receptacle terminal of a complementary mating connector (not shown).

It can be seen that the prefabricated assembly of substrate 10 and capacitor 14 provide both a ground plane and a filter for the electrical connector system shown in FIG. 7. It readily can be imagined that all kinds of electrical connector configurations or systems can be designed with the unique characteristics and advantages of the invention. Entire steps in fabricating known filter connectors with ground planes are eliminated by the technique of the invention.

Assemblies of substrate 10 and attached capacitors 14 can be produced in sheet form and adapted for all kinds of applications to facilitate mass production and mounting of electronic components in electrical connector systems. For instance, FIG. 8 shows a technique wherein a flexible substrate fabricated according to the invention can be produced in strip form, as at 40. The strip is shown by phantom lines 42 to be capable of cutting into discrete lengths for mounting to connector headers, for instance, of a particular length or width. Each discrete length of strip 40 includes a plurality of apertures 16 for receiving the capacitors 14 for coupling to a row of terminals (such as described in relation to FIG. 7) in a multi-terminal connector. The strip can be rolled onto a reel to facilitate easy feeding in a mass production assembly machine. In fact, strip 40 could have the capacitors 14 attached thereto and prepared with slots 20 as shown in FIG. 5, and the strip still could be rolled onto a reel and fed to an assembly machine which would bend the substrate, as shown in FIG. 6, and the entire preassembled strip could be fed to a connector feeding station for subsequent assembly into a system as depicted in FIG. 7. Again, whether the substrates are in sheet form, strip form, with or without capacitors preassembled thereto, it readily can be imagined how the unique system of the invention could facilitate the manufacture of filter connectors with ground planes in extremely cost-effective methods.

FIGS. 9-11 illustrate another form of the invention. Referring first to FIG. 9, a section of a flat flexible substrate 50 is shown with a plurality of U-shaped slots, generally designated 52, in a row along the substrate. The substrate is in the form of a laminate which includes a polyester film laminated to a ground film 54 such as of aluminum, copper or the like. Again, the outside shape or periphery of the substrate may be of various configurations depending upon the connector design or application with which the substrate is to be used.

FIG. 10 shows substrate 50 enlarged, with one of the U-shaped slots 52 in conjunction with an electronic component, such as a capacitor or other chip device, generally designated 14, which has opposite conductive sides 14a and 14b. Each U-shaped lost 52 is defined by a pair of leg portions 52a joined by a bight portion 52b.

It can be seen in FIG. 10 that capacitor 14 is attached to substrate 50 with one side 14a of the capacitor attached to the substrate outside the U-shaped slot, and with the other side 14b of the capacitor attached to the substrate inside the U-shaped slot. The conductive sides of the capacitor are attached to conductive film 54 of the substrate by appropriate means, such as conductive adhesive.

After U-shaped slots 52 are formed in substrate 50 as illustrated in FIG. 9, and after capacitors 14 are conductively attached to the substrate as illustrated in FIG. 10, the U-shaped slots are further cut, as illustrated at 56 in FIG. 11, to define an isolated portion 58 of the substrate surrounded 360° thereabout by the U-shaped slot and further cuts 56. The result is that conductive side 14b of capacitor 14 becomes electrically isolated from conductive side 14a of the capacitor as well as from conductive film 54 of substrate 50 outside the isolated area 58 within the slots or cuts.

At some point in the process of the invention, either before, during or after the formation of slots 52 or cuts 56, aperture means, generally designated 60, are cut in the substrate at locations to be within isolated area 58 of the substrate. The aperture means are provided for receiving a terminal through the substrate in conductive coupling to conductive side 14b of capacitor 14.

More particularly, in the illustrated preferred embodiment of the invention, an X-shaped slit 60a is cut in the substrate to form triangular deflectable portions meeting at an apex 60b. An appropriate terminal, indicated in phantom as at 62, can be pushed through aperture means 60 in such a manner as to engage conductive film 54 of the substrate. With the conductive film being shown in the drawings on the side of substrate 50 visible in the depictions. The terminal preferably would be inserted in the direction of arrow "A" to deflect the portions of the substrate about apex 60b inwardly whereupon the conductive film engages sides of the terminal. The terminal is fixed in the aperture means, as by conductive adhesive. It can be understood from FIG. 11 that terminal 62 is conductively coupled to conductive side 14b of capacitor 14 through the conductive film on isolated portion 58 of the terminal, and that conductive side 14a of the capacitor is conductively attached to conductive film 54 on the main portion of the substrate, outside the isolated areas 58, which forms the ground plane for the device.

As with the form or embodiment of the invention shown and described in relation to FIGS. 1-8, it readily can be imagined that all kinds of electrical connector configurations or systems can be designed with the unique characteristics of the form of the invention shown and described in relation to FIGS. 9-11. Again, entire steps in fabricating known filter connectors with ground planes are eliminated by the techniques of the invention. Assemblies of substrate 50 with or without capacitors 14 can be produced in sheet form and adapted for all kinds of applications to facilitate mass production and mounting of electronic components in electrical connector systems wherein substrate 50 forms the ground plane for a system. Like substrate 10, substrate 50 can be fabricated in strip form, the strip can be rolled onto a reel to facilitate easy feeding in a mass production assembly machine, and the strip could have the capacitors attached thereto and prepared with slots 52,56 ready to receive terminals 62.

It will be understood that the invention may be embodied in other specific forms without departing from the spirit or central characteristics thereof. The present examples and embodiments, therefore, are to be considered in all respects as illustrative and not restrictive, and the invention is not to be limited to the details given herein.

I claim:

1. A method for mounting electronic components such as capacitors having first and second conductive sides, to a flat flexible insulating substrate having conductive material thereon, comprising the steps of:
   attaching an electronic component to a given area of the substrate with the first conductive side of the component in electrical connection with said conductive material;
   forming a slot in the substrate substantially about the electronic component but less than 360° thereabout to define an integral hinge portion of the substrate; and
   bending the area of the substrate within said slot about the integral hinge portion to move said given area of the substrate out of its flat plane and thereby move the electronic component therewith into a desired position for connection of the second conductive side of the electronic component to an appropriate terminal.

2. The method of claim 1 wherein the electronic component is attached to the substrate by forming a cut in the substrate and inserting said one conductive side of the electronic component into the cut.

3. The method of claim 2, including applying a conductive adhesive between the conductive material on the substrate and the conductive side of the electronic component.

4. The method of claim 2, including forming said cut with an aperture having a width less than the wide of the electronic component and at least one slit in an edge of the aperture.

5. The method of claim 1, including applying a conductive adhesive between the conductive material on the substrate and the conductive side of the electronic component.

6. The method of claim 5 wherein said substrate is a laminate including an insulating film and a conductive film, and said conductive adhesive is applied in a local area about the electronic component.

7. The method of claim 1, including inserting an appropriate terminal through an opening in the substrate formed by moving said given area thereof out of the plane of the substrate, and electrically connecting the terminal to said opposite conductive end of the electronic component.

8. The method of claim 8, including connecting the terminal to the opposite end of the electronic component by means of a conductive adhesive.

9. A method for mounting electronic component, such as capacitors having first and second conductive surfaces, to a flat insulating substrate, comprising the steps of:
   attaching an electronic component to the insulating substrate with the first conductive side of the component generally in the plane of the substrate; and
   applying a conductive adhesive over a substantial area of the insulating substrate to provide a ground plane thereon in electrical connection with the first conductive side of the electronic component.

10. The method of claim 9 wherein the electronic component is attached to the substrate by forming a cut in the substrate and inserting said one conductive side of the electronic component into the cut.

11. The method of claim 10, including forming said cut with an aperture having a width less than the width of the electronic component and at least one slit in an edge of the aperture.

12. The method of claim 9, including inserting an appropriate terminal through an opening in the substrate and electrically connecting the terminal to an opposite conductive end of the electronic component.

13. The method of claim 12, including connecting the terminal to the opposite end of the electronic component by means of a conductive adhesive.

14. The method of claim 9 wherein said conductive material is applied by spraying.

15. A method for mounting electronic components, such as capacitors having first and second conductive sides, to a flat flexible insulating substrate having conductive material thereon, comprising the steps of:
   forming a tongue on the flexible substrate and defining an integral hinge portion of the substrate about which the tongue can be bent;
   attaching one conductive side of the electronic component to said tongue; and
   bending said tongue about the integral hinge portion to move the tongue out of the plane of the substrate and thereby move the electronic component therewith to one side of the substrate.

16. The method of 15 wherein said one conductive side of the electronic component is attached to the tongue by applying a conductive adhesive between the conductive material thereon and the one conductive side of the electronic component.

17. The method of claim 15 wherein the electronic component is attached to the tongue by forming a cut in the tongue and inserting said one conductive side of the electronic component into the cut.

18. The method of claim 17, including forming said cut with an aperture having a width less than the width of the electronic component and at least one slit in an edge of the aperture.

19. The method of claim 15 wherein said substrate, including said tongue, is a laminate having an insulating film and a conductive film, and the electronic component is attached to the tongue by applying a conductive adhesive in a local area about the electronic component.

20. The method of claim 15 wherein said tongue is formed by a slot in the substrate substantially about the electronic component but less than 360° thereabout to define said integral hinge portion of the substrate.

21. The method of claim 20, including inserting an appropriate terminal through an opening in the substrate formed by moving the tongue out of the plane of the substrate, and electrically connecting the terminal to the second conductive end of the electronic component.

22. The method of claim 15, including the step of attaching the substrate to a face of a complementary connector to define a ground plane therefor.

23. An electrical device, comprising:
a flat flexible insulating substrate having conductive material thereon and a tongue integral therewith and bent out of the flat plane thereof; and
an electronic component attached to said tongue and having a conductive side electrically connected to said conductive material wherein said tongue includes an aperture into which the conductive side of the electronic component is inserted, the aperture having a width less than the width of the electronic component and at least one slit in an edge of the aperture.

24. The electrical device of claim 23 wherein said substrate, including said tongue, is a laminate having an insulating film and a conductive film, and including conductive adhesive applied in a local area about the electronic component for attaching the component to the tongue.

25. The electrical device of claim 23 wherein said conductive material on the substrate covers a substantial area thereof, and the electronic component is attached to the conductive material by conductive adhesive.

26. In combination with the electrical device of claim 23, an electrical connector housing having said substrate attached to a generally flat face thereof to define a ground plane therefor.

27. The combination of claim 26 wherein said tongue is formed by a slot in the substrate substantially about the electronic component but less than 360° thereabout to define an integral hinge portion of the substrate, the tongue being bent out of the plane of the substrate to define an opening through the substrate.

28. The combination of claim 27, including a terminal extending through the opening in the substrate and electrically connected to an opposite conductive side of the electronic component.

29. A method for mounting electronic components, such as capacitors having two conductive sides, to a flat insulating substrate having conductive material thereon, comprising the steps of:
attaching an electronic component to the substrate with one conductive side of the component in electrical connection with said conductive material and the other conductive side of the component conductively isolated form the one side of the component and the conductive material to which the component is attached; and
inserting an electrical terminal through aperture means in the substrate for electrical connection to said other conductive side of the electronic component.

30. The method of claim 29 wherein said one conductive side of the electronic component is connected to the conductive material of the substrate by applying a conductive adhesive therebetween.

31. The method of claim 30 wherein the electronic component is attached to the substrate by forming a cut in the substrate and inserting said one conductive side of the electronic component into the cut.

32. The method of claim 31, including applying a conductive adhesive between the conductive material on the substrate and the conductive side of the electronic component.

33. The method of claim 31, including forming said cut with an aperture having a width less than the width of the electronic component and at least one slit in an edge of the aperture.

34. The method of claim 29 wherein both conductive sides of the electronic component are attached to the substrate and the other conductive side of the component then is conductively isolated from the one conductive side of the component by cutting a slot in the substrate 360° about said other conductive side.

35. The method of claim 34 wherein a generally U-shaped slot is cut in the substrate and said electronic component is attached to the substrate with said one side of the component attached to the substrate outside the U-shaped slot and with the other side of the component attached to the substrate inside the U-shaped slot, whereafter the slot is cut further to said 360°.

36. A method for mounting electronic components such as capacitors having two conductive sides, to a flat insulating substrate having conductive material thereon, comprising the steps of:
cutting a generally U-shaped slot in the substrate;
attaching an electronic component to the substrate with one conductive side of the component in electrical connecting with said conductive material outside the U-shaped slot and with the other conductive side of the component in electrical connection with the conductive material inside the U-shaped slot;
cutting the U-shaped slot further to form a closed slot surrounding said other side of the electronic component thereby isolating the other conductive side from the one side of the electronic component and the conductive material to which the component is attached;
forming aperture means in the substrate within the closed slot; and
inserting an electrical terminal through the aperture means for electrical connection to said other conductive side of the electronic component through the medium of the conductive material on the substrate within the closed slot.

37. The method of claim 36 wherein the conductive sides of the electronic component are connected to the conductive material of the substrate by applying a conductive adhesive therebetween.

38. The method of claim 37 wherein said terminal is connected to the conductive material of the substrate inside the closed slot by applying a conductive adhesive therebetween.

39. A method for mounting electronic components, such as capacitors having two opposite conductive sides, to a flat insulating substrate having conductive material thereon, comprising the steps of:
cutting a slot in the substrate;
attaching an electronic component to the substrate with opposite conductive sides of the component in electrical connection with said conductive material on opposite sides of said slot;
further cutting said slot into a closed configuration defining an isolated portion of the substrate 360° about one conductive side of the electronic component; and
attaching a terminal to the conductive material on said isolated portion of the substrate.

40. The method of claim 39 wherein the conductive sides of the electronic component are connected to the conductive material of the substrate by applying a conductive adhesive therebetween.

41. The method of claim 40 wherein said terminal is connected to the conductive material of the substrate inside the closed slot by applying a conductive adhesive therebetween.

42. An electrical device, comprising:
- a flat flexible insulating substrate having conductive material thereon and closed slot in the substrate defining an isolated portion thereof;
- an electronic component attached to the substrate with one conductive side of the component electrically connected to the conductive material inside the closed slot and the other conductive side of the electronic component electrically connected to the conductive material outside the closed slot; and
- a terminal electrically attached to the conductive material of the substrate inside the closed slot.

43. The electrical device of claim 42 wherein the conductive sides of the electronic component are electrically connected to the conductive material of the substrate by conductive adhesive.

44. The electrical device of claim 42 wherein said terminal projects through an aperture in the substrate within the closed slot, the terminal engaging the conductive material of the substrate within the closed slot.

45. The electrical device of claim 44 wherein the terminal is electrically connected to the conductive material by conductive adhesive.

* * * * *